United States Patent
Li et al.

(10) Patent No.: US 9,787,076 B2
(45) Date of Patent: Oct. 10, 2017

(54) TELESCOPIC DEVICE HAVING CARRIER MEMBER, CARRIER MEMBER, AND CABLE THEREOF

(71) Applicant: Wistron Corporation, New Taipei (TW)

(72) Inventors: Shih-Hao Li, New Taipei (TW); Wen-Chin Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/083,268

(22) Filed: Mar. 28, 2016

(65) Prior Publication Data

US 2017/0149229 A1    May 25, 2017

(30) Foreign Application Priority Data

Nov. 23, 2015  (TW) .............................. 104138714 A

(51) Int. Cl.
 *H05K 7/02* (2006.01)
 *H02G 11/00* (2006.01)

(52) U.S. Cl.
 CPC ............. *H02G 11/006* (2013.01); *H05K 7/02* (2013.01)

(58) Field of Classification Search
 None
 See application file for complete search history.

(56) References Cited

U.S. PATENT DOCUMENTS

| | | | | |
|---|---|---|---|---|
| 3,792,189 A | * | 2/1974 | Stengel | H02G 3/0437 174/69 |
| 5,041,002 A | * | 8/1991 | Byrne | H02G 3/288 439/211 |
| 5,149,017 A | * | 9/1992 | McEntire | B64F 1/305 14/71.5 |
| 5,556,059 A | | 9/1996 | Maeda | |
| 5,746,389 A | * | 5/1998 | Willmann | B65H 75/36 174/69 |

(Continued)

FOREIGN PATENT DOCUMENTS

TW    I220359    8/2004

OTHER PUBLICATIONS

Office action dated Jul. 29, 2016 for TW application No. 104138714, filing date: Nov. 23, 2015, p. 1 line 13-14 and pp. 2-6.

*Primary Examiner* — Xanthia C Cunningham
(74) *Attorney, Agent, or Firm* — Winston Hsu

(57) ABSTRACT

A carrier member includes a first section, a second section, and a third section. The first section has a first length. The second section has a second length. The first section, the third section, and the second section connect sequentially and form a U-shaped structure. The first section and the second section have curved sections. The third section has a flat section. When the second section moves relative to the first section, the first section or the second section having the curved section transform into the third section having the flat section and store a resilient recovering force, and the third section having the flat section transforms into the first section or the second section having the curved section for adjusting lengths of the first section and the second section, which prevents a cable disposed on the carrier member from interfering with other mechanism or getting knotted.

27 Claims, 6 Drawing Sheets

(56) References Cited

U.S. PATENT DOCUMENTS

| | | | | |
|---|---|---|---|---|
| 6,405,843 B1* | 6/2002 | Friedman | H01B 7/0869 | 191/12.4 |
| 6,444,903 B2* | 9/2002 | Saeki | H02G 3/0608 | 174/135 |
| 6,573,451 B2* | 6/2003 | Komiya | H02G 11/006 | 174/68.1 |
| 6,724,613 B2* | 4/2004 | Doshita | B60R 16/0215 | 174/135 |
| 7,057,110 B2* | 6/2006 | Tsubaki | H02G 11/00 | 174/69 |
| 7,183,502 B1* | 2/2007 | Johnston | H02G 3/0431 | 174/480 |
| 7,306,481 B2* | 12/2007 | Tsukamoto | B60R 16/0215 | 174/135 |
| 7,402,044 B2* | 7/2008 | Terada | B60N 2/06 | 174/72 A |
| 7,478,972 B2* | 1/2009 | Takamori | G06F 1/1622 | 248/292.13 |
| 7,532,801 B2 | 5/2009 | Mui | | |
| 7,641,260 B2* | 1/2010 | Ide | B60R 16/0222 | 296/155 |
| 7,677,499 B2* | 3/2010 | Weaver | B64D 15/12 | 174/69 |
| 7,729,132 B2* | 6/2010 | Yamamoto | B60R 16/0207 | 174/72 A |
| 8,033,622 B2* | 10/2011 | Oh | F25D 25/025 | 312/223.6 |
| 8,237,053 B2* | 8/2012 | Katou | B60R 16/027 | 174/68.1 |
| 8,547,604 B2* | 10/2013 | Kozaki | H04N 1/00559 | 271/10.03 |
| 8,594,752 B2* | 11/2013 | Kim | H04M 1/0237 | 455/575.3 |
| 8,633,386 B2* | 1/2014 | Gong | H01R 13/72 | 174/69 |
| 8,889,987 B2* | 11/2014 | Yamaguchi | B60R 16/0215 | 174/135 |
| 9,088,117 B2* | 7/2015 | Rosenblum | H01R 25/006 | |
| 9,197,053 B2* | 11/2015 | Berger | H02G 11/02 | |
| 9,523,531 B2* | 12/2016 | Han | F25D 25/025 | |
| 2003/0127408 A1* | 7/2003 | Schneider | B66C 23/905 | 212/281 |
| 2004/0182594 A1 | 9/2004 | Chen | | |
| 2005/0205286 A1 | 9/2005 | Chen | | |
| 2006/0042175 A1* | 3/2006 | Crespi | B66C 13/12 | 52/111 |
| 2006/0056165 A1* | 3/2006 | Tsunoda | H02G 11/00 | 361/826 |
| 2006/0097611 A1* | 5/2006 | Kim | A47B 51/00 | 312/402 |
| 2006/0134970 A1* | 6/2006 | Watanabe | H02G 11/00 | 439/501 |
| 2007/0059963 A1 | 3/2007 | Chen | | |
| 2008/0072498 A1* | 3/2008 | Rogers | E05F 15/646 | 49/360 |
| 2008/0144265 A1* | 6/2008 | Aoki | G06F 1/1601 | 361/679.04 |
| 2008/0174942 A1* | 7/2008 | Yang | G06F 1/1616 | 361/679.27 |
| 2009/0046032 A1* | 2/2009 | Opitz | H01Q 1/103 | 343/903 |
| 2009/0273894 A1* | 11/2009 | Yang | F16F 1/04 | 361/679.27 |
| 2010/0197372 A1* | 8/2010 | Takagi | F16H 21/40 | 455/575.4 |
| 2010/0214761 A1* | 8/2010 | Matsukawa | H02G 11/00 | 361/826 |
| 2010/0307787 A1* | 12/2010 | Ohmori | H01Q 1/243 | 174/51 |
| 2010/0323769 A1* | 12/2010 | Peng | H04M 1/0274 | 455/575.4 |
| 2010/0331060 A1* | 12/2010 | Yoshida | H01R 35/00 | 455/575.1 |
| 2011/0188189 A1* | 8/2011 | Park | G05B 11/01 | 361/679.05 |
| 2011/0308852 A1* | 12/2011 | Kobayashi | H04M 1/0237 | 174/560 |
| 2012/0028692 A1* | 2/2012 | Nishizono | H01Q 1/243 | 455/575.1 |
| 2013/0058063 A1* | 3/2013 | O'Brien | G06F 1/1624 | 361/807 |
| 2013/0062837 A1* | 3/2013 | Sasaki | H04M 1/0235 | 277/650 |
| 2013/0225248 A1* | 8/2013 | Takagi | H04M 1/021 | 455/575.3 |
| 2013/0331154 A1* | 12/2013 | Huang | H04M 1/0274 | 455/575.4 |
| 2014/0174780 A1* | 6/2014 | Hamada | G06F 1/1624 | 174/50 |
| 2015/0335387 A1* | 11/2015 | Atzinger | A61B 19/2203 | 606/130 |

\* cited by examiner

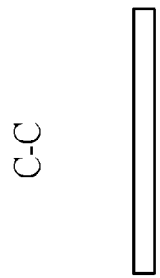
FIG. 3A
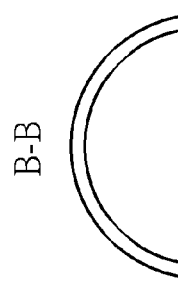
FIG. 3B
FIG. 3C
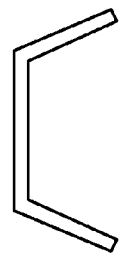
FIG. 3D
FIG. 3E
FIG. 3F
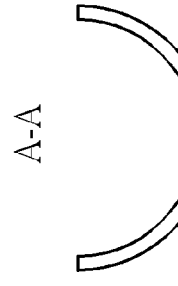
FIG. 3G
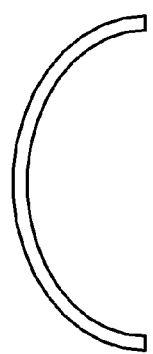
FIG. 3H
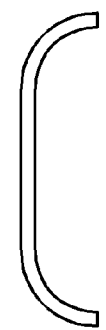
FIG. 3I

TELESCOPIC DEVICE HAVING CARRIER MEMBER, CARRIER MEMBER, AND CABLE THEREOF

BACKGROUND OF THE INVENTION

1. Field of the Invention

The present disclosure relates to a carrier, and more particularly, to a flexible and resilient carrier member capable of carrying a cable, a cable therewith, and a telescope therewith.

2. Description of the Prior Art

In order to prevent interference between a cable and mechanical components nearby, a conventional telescopic device usually uses a cable carrier, such as a chain mechanism, which drives the cable to fit in with the telescope device as the telescopic device extends and retracts back and forth. However, since a cable carrier in the form of chain mechanism is constructed by a plurality of track sections connected sequentially, limitation of the pitch between track sections gives the cable carrier a large bending radius, which renders such type of cable carrier not a proper choice for smaller telescopic devices. Furthermore, the longer the cable carrier, the greater weight it gets. Therefore, it has become a subject of research in the field to figure out a way to drive a cable within telescopic device with limited space and in the meantime, to reduce the weight and the manufacturing cost of the device.

SUMMARY OF THE INVENTION

It is an objective of the present disclosure to provide a telescopic device having carrier member, a carrier member, and a cable thereof for solving the aforementioned problems.

In order to achieve the aforementioned objective, a telescopic device having carrier member includes a first body, a second body, a carrier member, and a cable. A first electronic device is disposed on the first body. The second body is slidably disposed on the first body. A second electronic device is disposed on the second body. The second body is selectively movable toward the first body along a first direction or away from the first body along a second direction opposite to the first direction. The carrier member includes a first section, a second section, and a third section. An end of the first section is fixed on the first body. An end of the second section is fixed on the second body. The other end of the first body is connected to the other end of the second body via the third section. The cable is connected to the first electronic device and the second electronic device. A part of the cable is disposed on the carrier member.

According to an embodiment of the present disclosure, the first section has a first length. The second section has a second length. The cable includes a first segment, a second segment, and a third segment. The first segment is disposed on and extends along the first section. The first segment has a first segment length corresponding to the first length of the first section. The second segment is disposed on and extends along the second section. The second segment has a second segment length corresponding to the second length of the second section. The third segment is disposed on and extends along the third section. The first segment is connected to the second segment via the third segment.

According to an embodiment of the present disclosure, the first section, the third section, and the second section form a U-shaped structure, and the first segment, the third segment, and the second segment form a U-shaped structure.

According to an embodiment of the present disclosure, when the second body moves toward the first body along the first direction, the first length of the first section and the first segment length of the first segment increase gradually, and the second length of the second section and the second segment length of the second segment decrease gradually. When the second body moves away from the first body along the second direction, the first length of the first section and the first segment length of the first segment decrease gradually, and the second length of the second section and the second segment length of the second segment increase gradually.

According to an embodiment of the present disclosure, the telescopic device further includes a control module and a control cable. The control module is disposed on the first body. The control cable is connected to the first electronic device and the control module. The cable is connected to the second electronic device and the control module.

According to an embodiment of the present disclosure, the carrier member is flexible and resilient. Each of the first section and the second section has a non-straight cross section, and the third section has a straight cross section.

According to an embodiment of the present disclosure, when the second body moves toward the first body along the first direction, the other end of the second section is forced to resiliently deform from the non-straight cross section to the straight cross section, and a resilient recovering force is stored therein. An end of the third section near the first section is forced to resiliently deform from the straight cross section to the non-straight cross section due to the resilient force.

According to an embodiment of the present disclosure, when the second body moves away from the first body along the second direction, the other end of the first section is forced to resiliently deform from the non-straight cross section to the straight cross section, and a resilient recovering force is stored therein. An end of the third section near the second section is forced to resiliently deform from the straight cross section to the non-straight cross section due to the resilient force.

According to an embodiment of the present disclosure, the carrier member further includes a plurality of passive components disposed on the first section and the second section and fastening the cable.

According to an embodiment of the present disclosure, the plurality of passive components is a plurality of engaging hooks bent upward from the first section and the second section.

According to an embodiment of the present disclosure, the cable extends along outer surfaces of the first section, the third section, and the second section.

According to an embodiment of the present disclosure, the cable extends along inner surfaces of the first section, the third section, and the second section.

In order to achieve the aforementioned object, a carrier member is adapted for a telescopic device. The telescopic device includes a first body, a second body, a control module, a control cable, and a cable. A first electronic device is disposed on the first body. The second body is slidably disposed on the first body. A second electronic device is disposed on the second body. The second body is selectively movable toward the first body along a first direction or away from the first body along a second direction opposite to the first direction. The control module is disposed on the first body. The control cable is connected to the first electronic device and the control module. The cable is connected to the second electronic device and the control module. The carrier member includes a first section, a second section, and a third section. An end of the first section is fixed on the first body. An end of the second section is fixed on the second body. The other end of the first section is connected to the other end of the second section via the third section.

In order to achieve the aforementioned object, a cable is adapted for a telescopic device. The telescopic device includes a first body, a second body, and a control module. A first electronic device is disposed on the first body. The second body is slidably disposed on the first body. A second electronic device is disposed on the second body. The cable includes a carrier member, an insulating layer, a conductive layer, and a covering layer. The carrier member includes a first section, a second section, and a third section. An end of the first section is fixed on the first body. An end of the second section is fixed on the second body. The other end of the first section is connected to the other end of the second section via the third section. The insulating layer has a first side and a second side opposite to the first side. The first side of the insulating layer is disposed on a side of the carrier member. The conductive layer has a third side and a fourth side opposite to the third side. The third side of the conductive layer is disposed on the second side of the insulating layer. The conductive layer includes a first segment, a second segment, and a third segment. The first segment is disposed on and extends along the first section. The second segment is disposed on and extends along the second section. The third segment is disposed on and extends along the third section. The first segment is connected to the second segment via the third segment. The covering layer is disposed on the fourth side of the conductive layer for covering the conductive layer.

In summary, the telescopic device of the present disclosure can effectively prevent interference between the cable and other mechanical components. Therefore, the cable does not get knotted at all, which prevents a short circuit or damage of the cable caused by knotting.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

FIG. 3A to FIG. 3C are sectional diagrams of the carrier member respectively along A-A, B-B, and C-C lines shown in FIG. 2 according to the embodiment of the present disclosure.

FIG. 3D to FIG. 3I are sectional diagrams of a first section and a second section of a carrier member according to other embodiments of the present disclosure.

DETAILED DESCRIPTION

In the following detailed description of the preferred embodiments, reference is made to the accompanying drawings which form a part hereof, and in which is shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. Accordingly, the drawings and descriptions will be regarded as illustrative in nature and not as restrictive.

Figure 1:
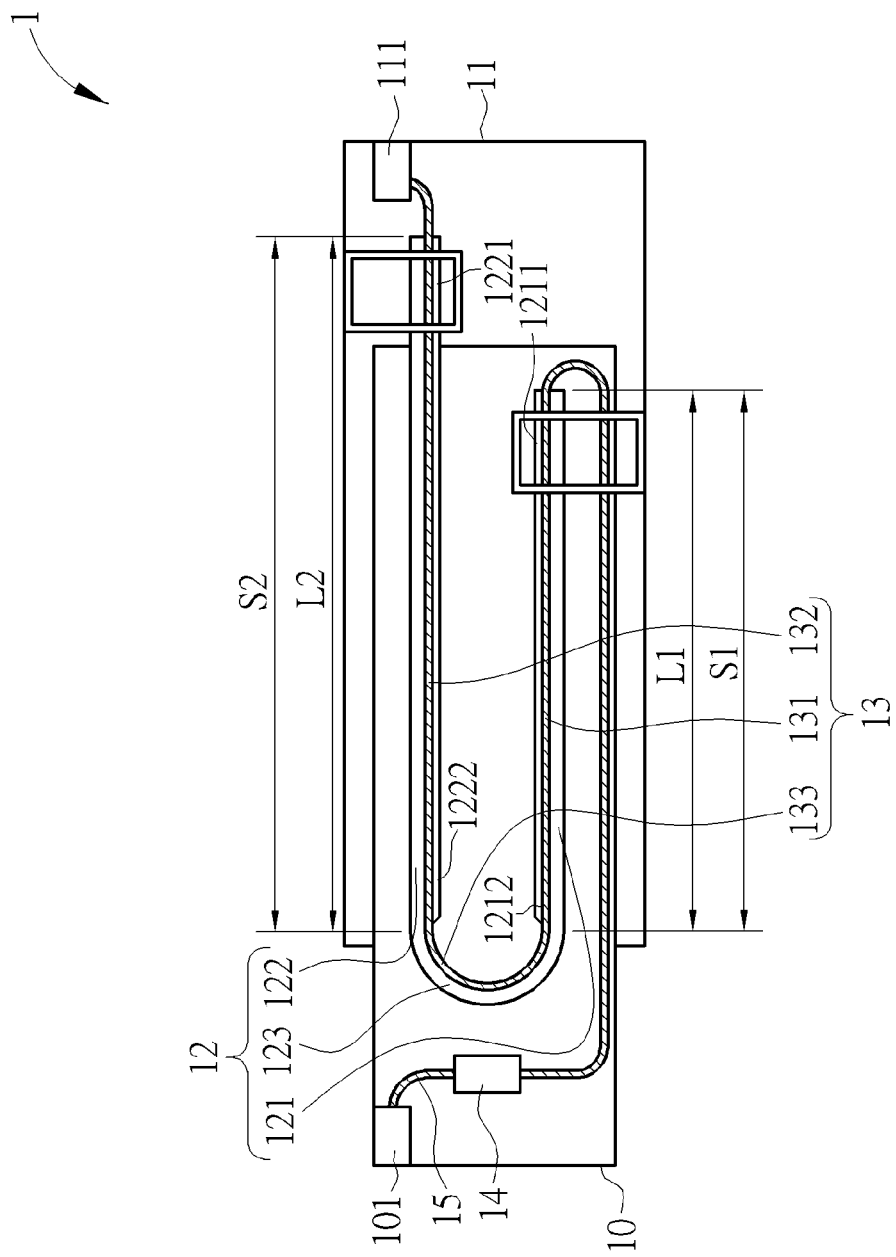
FIG. 1 is a diagram illustrating internal components of a telescopic device according to an embodiment of the present disclosure.

Please refer to FIG. 1. FIG. 1 is a diagram illustrating internal components of a telescopic device 1 according to an embodiment of the present disclosure. As shown in FIG. 1, the telescopic device 1 includes a first body 10, a second body 11, a carrier member 12, a cable 13, a control module 14, and a control cable 15. A first electronic device 101 is disposed on the first body 10. The second body 11 is slidably disposed on the first body 10. A second electronic device 111 is disposed on the second body 11. In this embodiment, the telescopic device 1 can be an add-on touch sensing module disposed on a thin flat panel display. The first body 10 and the second body 11 are slidable relative to each other for prolonging or reducing the length of the telescopic device 1 to be adapted to the width of the flat panel display where the telescopic device 1 is disposed. The first electronic device 101 and the second electronic device 111 can be camera lens for capturing motion of a gesture and a position of a touch point, which allows the telescopic device 1 to provide an additional touch function for a television or a monitor having no such function in the first place. In other words, when the telescopic device 1 is applied to such devices, the width and the depth of the telescopic device 1 become one of the main concerns to be limited to a relatively small dimension besides the discussion of variable length of the telescopic device 1. Therefore, the cable 13 contained within the first body 10 and the second body 11 needs to be designed for preventing interference with the first body 10 and the second body 11 as the telescopic device 1 extends or retracts, such that the cable 13 does not get knotted at all, and a short circuit or damage of the cable 13 caused by getting knotted can be prevented. In addition to the aforementioned embodiment, the telescopic device 1 can also be applied to other fields, and it depends on practical demands.

The carrier member 12 includes a first section 121, a second section 122, and a third section 123. An end 1211 of the first section 121 is fixed on the first body 10. The first section 121 comes with a first length L1. An end 1221 of the second section 122 is fixed on the second body 11. The second section 122 comes with a second length L2. The other end 1212 of the first section 121 is connected to the other end 1222 of the second section 122 via the third section 123. The first section 121, the third section 123, and the second section 122 as a whole form a U-shaped structure. The control module 14 is disposed on the first body 10. The control cable 15 is connected to the first electronic device 101 and the control module 14. The cable 13 is connected to the second electronic device 111 and the control module 14. A part of the cable 13 is disposed on the carrier member 12. Specifically, the cable 13 includes a first segment 131, a second segment 132, and a third segment 133. The first segment 131 is disposed on the first section 121 and extends along an inner surface of the first section 121. The first segment 131 comes with a first segment length S1 corresponding to the first length L1 of the first section 121. The second segment 132 is disposed on the second section 122 and extends along an inner surface of the second section 122. The section segment 132 comes with a second segment length S2 corresponding to the second length L2 of the second section 122. The third segment 133 is disposed on the third section 123 and extends along an inner surface of the third section 123. The first segment 131 is connected to the second segment 132 via the third segment 133. The first segment 131, the third segment 133, and the second segment 132 as a whole form a U-shaped structure. In another embodiment, the first segment 131 can also be disposed to extend along an outer surface of the first section 121, the second segment 132 can also be disposed to extend along an outer surface of the second section 122, and the third segment 133 can also be disposed to extend along an outer surface of the third section 123.

Figure 2:
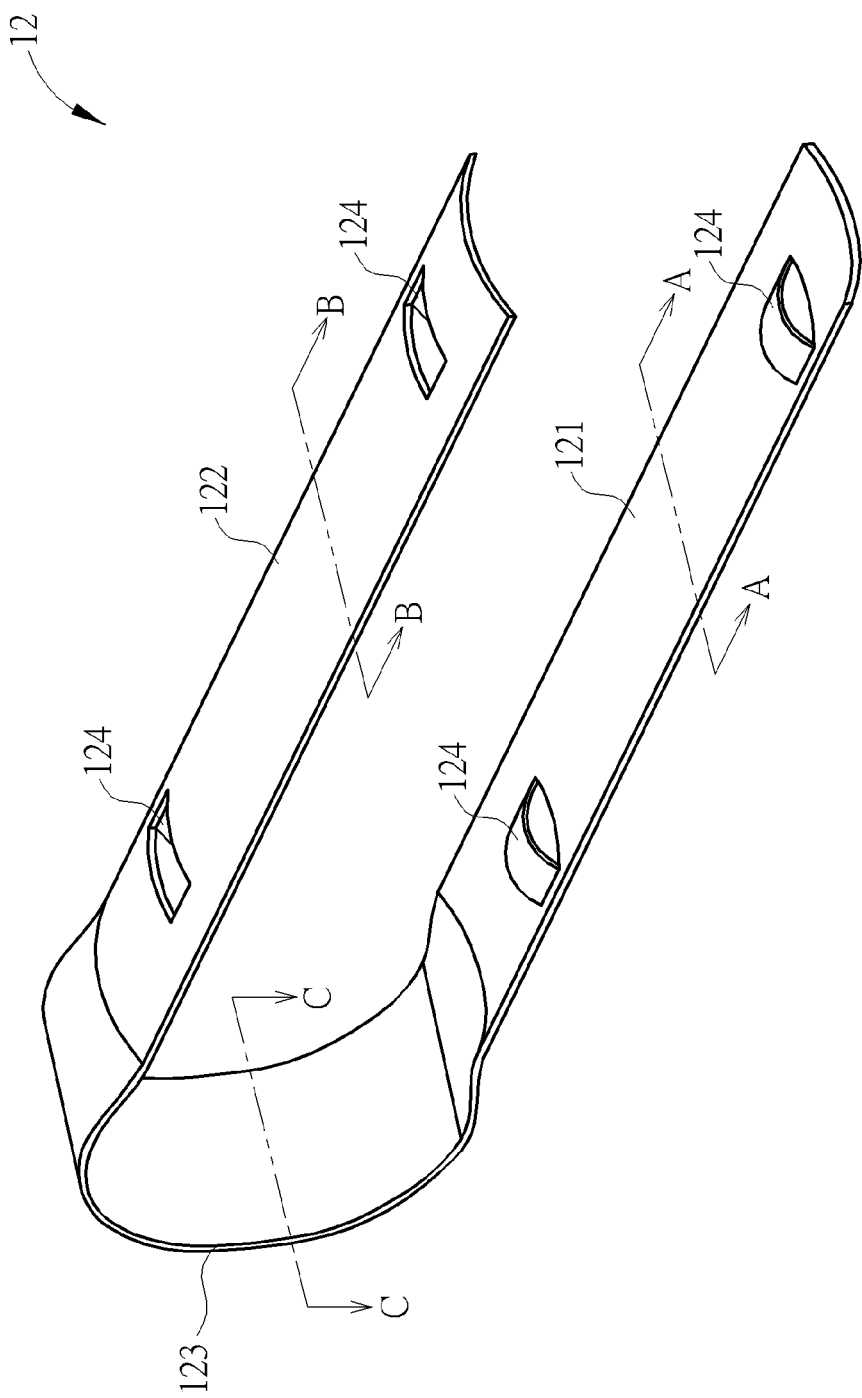
FIG. 2 is a schematic diagram of a carrier member according to the embodiment of the present disclosure.

Please refer to FIG. 2 to FIG. 3C. FIG. 2 is a schematic diagram of the carrier member 12 according to the embodiment of the present disclosure. FIG. 3A to FIG. 3C are sectional diagrams of the carrier member 12 respectively along A-A, B-B, and C-C lines shown in FIG. 2 according to the embodiment of the present disclosure. The carrier member 12 is flexible and resilient as shown in FIG. 2, where each of the first section 121 and the second section 122 of the carrier member 12 has a non-straight cross section as shown in FIG. 3A and FIG. 3B and the third section 123 has a straight cross section as shown in FIG. 3C. Specifically, in this embodiment, each of the first section 121 and the second section 122 of the carrier member 12 can have a curved cross section, as shown in FIG. 3A and FIG. 3B. However, it is not limited to this embodiment. Please refer to FIG. 3D to FIG. 3I. FIG. 3D to FIG. 3I are sectional diagrams of the first section 121 and the second section 122 of the carrier member 12 according to other embodiments of the present disclosure. The cross section of the first section 121 and the second section 122 of the embodiments of the disclosure can be an arc as shown in FIG. 3D, a curve with straight lines as shown in FIG. 3E, a basin as shown in FIG. 3F and FIG. 3G, a multi arc as shown in FIG. 3H, or a curve with hooks as shown in FIG. 3I. Additionally, the carrier member 12 can further include a plurality of passive components 124 disposed on the first section 121 and the second section 122 for fastening the first segment 131 and the second segment 132 respectively. In this embodiment, the plurality of passive components 124 can be a plurality of engaging hooks bent upward from the first section 121 and the second section 122. However, the number and the configuration of the passive components 124 are not limited to this embodiment, and it depends on practical demands.

Figure 4:
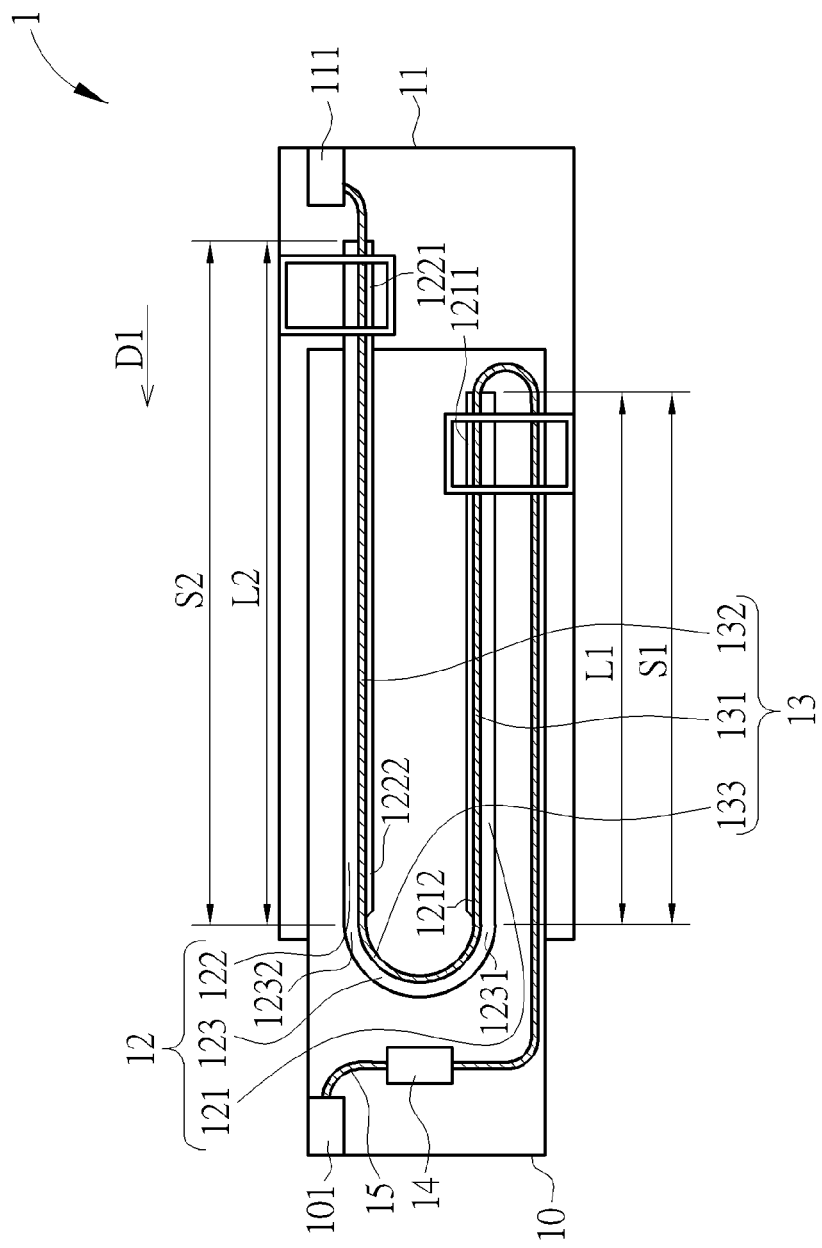
FIG. 4 and FIG. 5 are diagrams illustrating a first body and a second body of the telescopic device at different relative positions according to the embodiment of the present disclosure.
Figure 5:
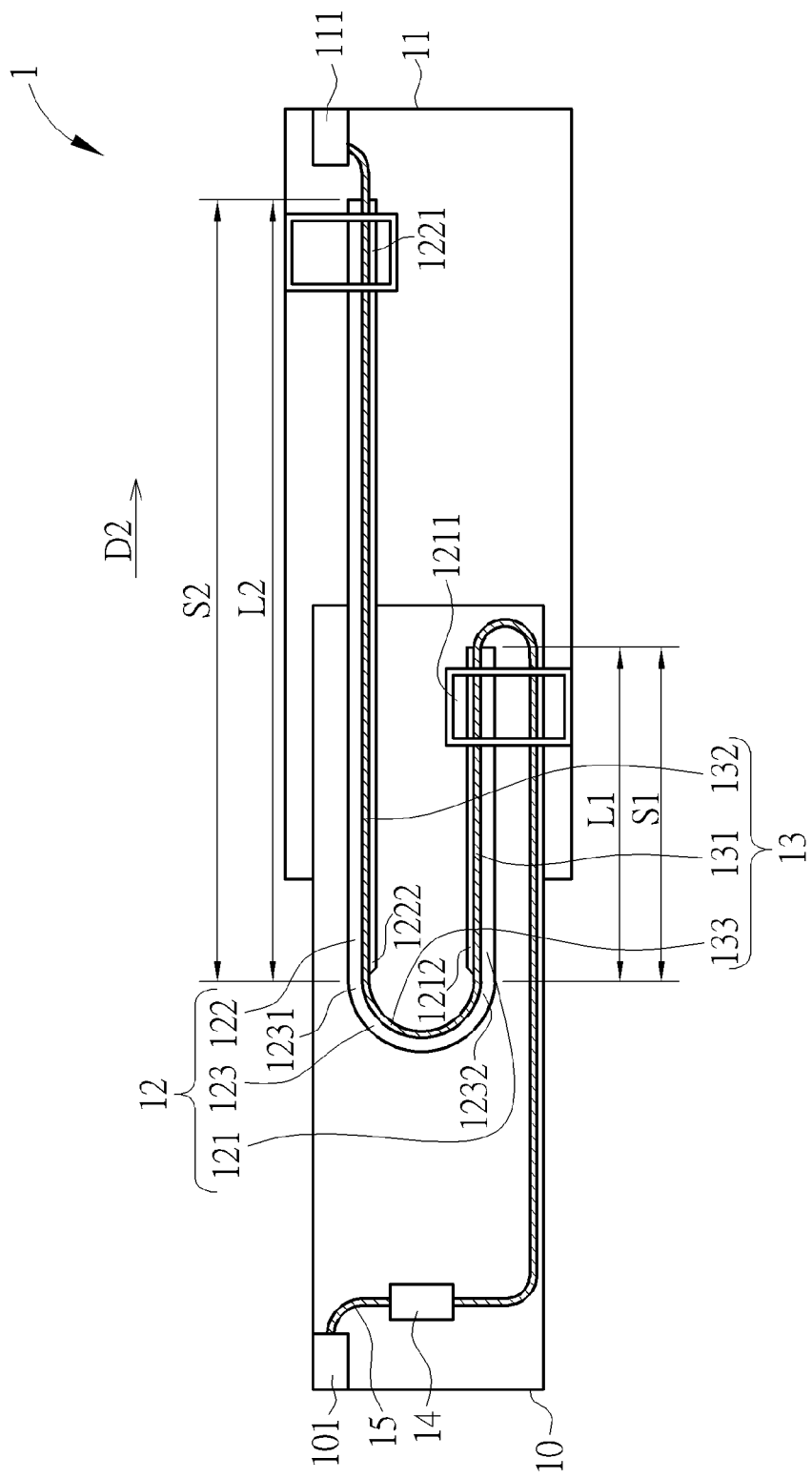

Please refer to FIG. 4 and FIG. 5. FIG. 4 and FIG. 5 are diagrams illustrating the first body 10 and the second body 11 of the telescopic device 1 at different relative positions according to the embodiment of the present disclosure. As shown in FIG. 4, to retract the telescopic device 1, the second body 11 is moved toward the first body 10 along a first direction D1. The other end 1222 of the second section 122 is forced to resiliently deform from the non-straight cross section to become the straight cross section of the third section 123, and a resilient recovering force is stored therein. An end 1231 of the third section 123 near the first section 121 is forced to resiliently deform from the straight cross section to become the non-straight cross section of the first section 121 due to the resilient force. Therefore, the first length L1 of the first section 121 of the carrier member 12 increases gradually, and the second length L2 of the second section 122 decreases gradually. In the meantime, the cable 13 is driven to move by the carrier member 12, such that the first segment length S1 of the first segment 131 increases gradually along with the first length L1 of the first section 121, and the second segment length S2 of the second segment 132 decreases gradually along with the second length L2 of the second section 122. In such way, during the process that the telescopic device 1 retracts, i.e., when the second body 11 moves toward the first body 10 along the first direction D1, the cable 13 is driven and restricted by the carrier member 12, which prevents interference between the cable 13 and the first body 10 and the second body 11. Therefore, the cable 13 does not get knotted easily, which prevents short circuit or damage of the cable 13 caused by getting knotted.

Oh the other hand, as shown in FIG. 5, when the second body 11 moves away from the first body 10 along the second direction D2, the other end 1212 of the first 121 is forced to resiliently deform from the non-straight cross section to become the straight cross section of the third section 123, and a resilient recovering force is stored therein. An end 1232 of the third section 123 near the second section 122 is forced to resiliently deform from the straight cross section to become the non-straight cross section of the second section 122 due to the resilient force. In other words, the first length L1 of the first section 121 decreases gradually, and the second length L2 of the second section 122 increases gradually. In the meantime, the cable 13 is driven to move by the carrier member 12, such that the first segment length S1 of the first segment 131 of the cable 13 decreases gradually along with the first length L1 of the first section 121 of the carrier member 12, and the second segment length S2 of the second segment 132 of the cable 13 increases gradually along with the second length L2 of the second section 122 of the carrier member 12. Therefore, during the process that the telescopic device 1 extends, i.e., when the second body 11 moves away from the first body 10 along the second direction D2, the cable 13 is driven and restricted by the carrier member 12, which prevents interference between the cable 13 and the first body 10 and the second body 11. Therefore, the cable 13 does not get knotted easily, which prevents short circuit or damage of the cable 13 caused by getting knotted.

Figure 6:
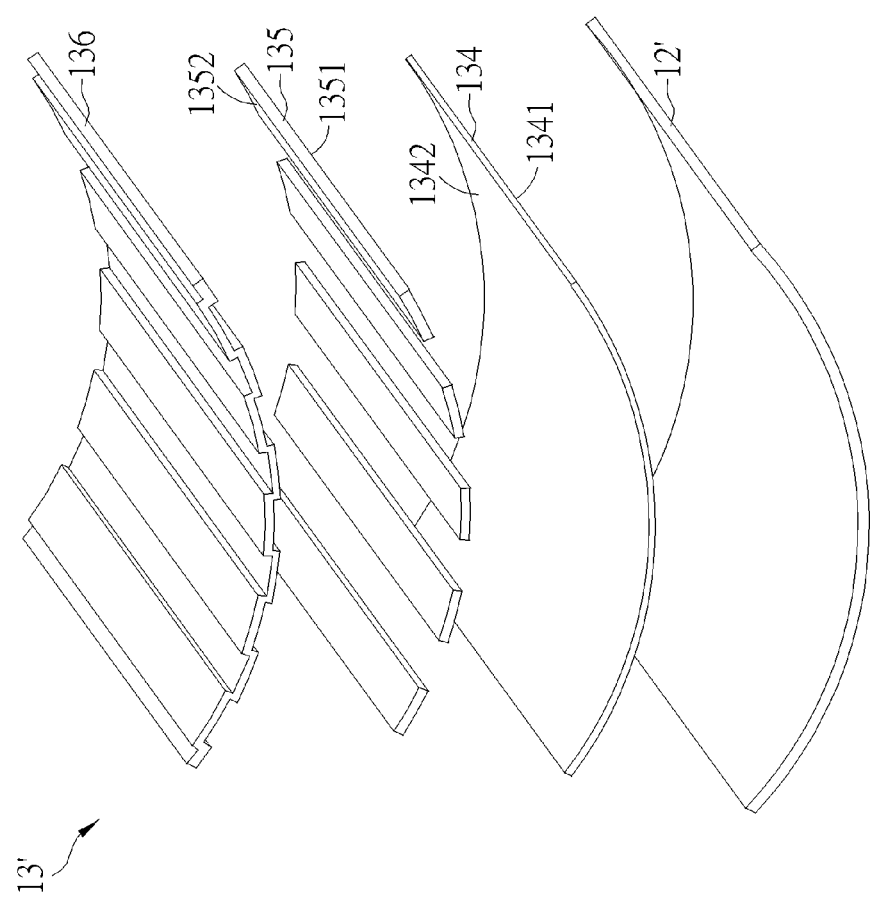
FIG. 6 is an exploded diagram of a cable according to another embodiment of the present disclosure.

In addition to the aforementioned embodiment, in another embodiment, the carrier member can be incorporated in the structure of a cable. Please refer to FIG. 6. FIG. 6 is an exploded diagram of a cable 13' according to another embodiment of the present disclosure. Different from the aforementioned embodiment, the cable 13' includes a carrier member 12', an insulating layer 134, a conductive layer 135, and a covering layer 136. The insulating layer 134 has a first side 1341 and a second side 1342 opposite to the first side 1341. The first side 1341 of the insulating layer 134 is disposed on a side of the carrier member 12'. The conductive layer 135 has a third side 1351 and a fourth side 1352 opposite to the third side 1351. The third side 1351 of the conductive layer 135 is disposed on the second side 1342 of the insulating layer 134. The covering layer 136 is disposed on the fourth side 1352 of the conducting layer 135 for covering the conductive layer 135. In other words, in this embodiment, the carrier member 12' and the cable 13' are integrated with each other instead of two separate independent components. Structure and operation of other components in this embodiment are similar to the ones in aforementioned embodiment. Detail descriptions are omitted herein for simplicity.

In contrast to the prior art, the telescopic device of the present disclosure utilizes the carrier member for driving the cable to move. When the second body moves toward the first body along the first direction, the first length of the first section of the carrier member and the first segment length of the first segment of the cable increase gradually, and the second length of the second section of the carrier member and the second segment length of the second segment of the cable decrease gradually. When the second body moves away from the first body along the second direction, the first length of the first section of the carrier member and the first segment length of the first segment of the cable decrease gradually, and the second length of the second section of the carrier member and the second segment length of the second segment of the cable increase gradually. It prevents interference between the cable and other components when the telescopic device extends or retracts back and forth, such that the cable does not get knotted easily, which prevents a short circuit or damage of the cable caused by getting knotted.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A telescopic device having carrier member, comprising:
   a first body, a first electronic device being disposed on the first body;
   a second body slidably disposed on the first body, a second electronic device being disposed on the second body, the second body selectively movable toward the first body along a first direction or away from the first body along a second direction opposite to the first direction;
   a carrier member comprising:
      a first section, an end of the first section being fixed on the first body;
      a second section, an end of the second section being fixed on the second body; and
      a third section, another end of the first body being connected to another end of the second body via the third section; and
   a cable connected to the first electronic device and the second electronic device, a part of the cable being disposed on the carrier member.

2. The telescopic device of claim 1, wherein the first section has a first length, the second section has a second length, and the cable comprises:
   a first segment disposed on and extending along the first section, the first segment having a first segment length corresponding to the first length of the first section;
   a second segment disposed on and extending along the second section, the second segment having a second segment length corresponding to the second length of the second section; and
   a third segment disposed on and extending along the third section, the first segment being connected to the second segment via the third segment.

3. The telescopic device of claim 2, wherein the first section, the third section, and the second section form a U-shaped structure, and the first segment, the third segment, and the second segment form a U-shaped structure.

4. The telescopic device of claim 2, wherein when the second body moves toward the first body along the first direction, the first length of the first section and the first segment length of the first segment increase gradually, and the second length of the second section and the second segment length of the second segment decrease gradually; when the second body moves away from the first body along the second direction, the first length of the first section and the first segment length of the first segment decrease gradually, and the second length of the second section and the second segment length of the second segment increase gradually.

5. The telescopic device of claim 1, further comprising:
   a control module disposed on the first body; and
   a control cable connected to the first electronic device and the control module, the cable being connected to the second electronic device and the control module.

6. The telescopic device of claim 1, wherein the carrier member is flexible and resilient, each of the first section and the second section has a non-straight cross section, and the third section has a straight cross section.

7. The telescopic device of claim 6, wherein when the second body moves toward the first body along the first direction, the another end of the second section is forced to resiliently deform from the non-straight cross section to the straight cross section, a resilient recovering force is stored therein, and an end of the third section near the first section is forced to resiliently deform from the straight cross section to the non-straight cross section due to the resilient force.

8. The telescopic device of claim 6, wherein when the second body moves away from the first body along the second direction, the another end of the first section is forced to resiliently deform from the non-straight cross section to the straight cross section, a resilient recovering force is stored therein, and an end of the third section near the second section is forced to resiliently deform from the straight cross section to the non-straight cross section due to the resilient force.

9. The telescopic device of claim 1, wherein the carrier member further comprises a plurality of passive components disposed on the first section and the second section and fastening the cable.

10. The telescopic device of claim 9, wherein the plurality of passive components is a plurality of engaging hooks bent upward from the first section and the second section.

11. The telescopic device of claim 1, wherein the cable extends along outer surfaces of the first section, the third section, and the second section.

12. The telescopic device of claim 1, wherein the cable extends along inner surfaces of the first section, the third section, and the second section.

13. A carrier member adapted for a telescopic device, the telescopic device comprising a first body, a second body, a control module, a control cable, and a cable, a first electronic device being disposed on the first body, the second body being slidably disposed on the first body, a second electronic device being disposed on the second body, the second body selectively movable toward the first body along a first direction or away from the first body along a second direction opposite to the first direction, the control module being disposed on the first body, the control cable being connected to the first electronic device and the control module, the cable being connected to the second electronic device and the control module, the carrier member comprising:
   a first section, an end of the first section being fixed on the first body;
   a second section, an end of the second section being fixed on the second body; and
   a third section, another end of the first section being connected to another end of the second section via the third section.

14. The carrier member of claim 13, wherein the first section has a first length, the second section has a second length, the cable comprises a first segment, a second segment, and a third segment, the first segment is disposed on and extends along the first section, the first segment has a first segment length corresponding to the first length of the first section, the second segment is disposed on and extends along the second section, the second segment has a second segment length corresponding to the second length of the second section, the third segment is disposed on and extends along the third section, the first segment is connected to the second segment via the third segment.

15. The carrier member of claim 14, wherein the first section, the third section, and the second section form a U-shaped structure, and the first segment, the third segment, and the second segment form a U-shaped structure.

16. The carrier member of claim 14, wherein when the second body moves toward the first body along the first direction, the first length of the first section and the first segment length of the first segment increases gradually, and the second length of the second section and the second segment length of the second segment decreases gradually; when the second body moves away from the first body along the second direction, the first length of the first section and the first segment length of the first segment decrease gradually, and the second length of the second section and the second segment length of the second segment increase gradually.

17. The carrier member of claim 13, being flexible and resilient, each of the first section and the second section has a non-straight cross section, and the third section has a straight cross section.

18. The carrier member of claim 17, wherein when the second body moves toward the first body along the first direction, the another end of the second section is forced to resiliently deform from the non-straight cross section to the straight cross section and a resilient recovering force is stored therein, and an end of the third section near the first section is forced to resiliently deform from the straight cross section to the non-straight cross section due to the resilient force.

19. The carrier member of claim 17, wherein when the second body moves away from the first body along the second direction, the another end of the first section is forced to resiliently deform from the non-straight cross section to the straight cross section and a resilient recovering force is stored therein, and an end of the third section near the second section is forced to resiliently deform from the straight cross section to the non-straight cross section due to the resilient force.

20. The carrier member of claim 13, further comprising a plurality of passive components disposed on the first section and the second section for fastening the cable.

21. The carrier member of claim 20, wherein the plurality of passive components is a plurality of engaging hooks bent upward from the first section and the second section.

22. The carrier member of claim 13, wherein the cable extends along outer surfaces of the first section, the third section, and the second section.

23. The carrier member of claim 13, wherein the cable extends along inner surfaces of the first section, the third section, and the second section.

24. A cable adapted for a telescopic device, the telescopic device comprising a first body, a second body, and a control module, a first electronic device being disposed on the first body, the second body being slidably disposed on the first body, a second electronic device being disposed on the second body, the cable comprising:
   a carrier member comprising:
      a first section, an end of the first section being fixed on the first body;
      a second section, an end of the second section being fixed on the second body; and
      a third section, another end of the first section being connected to another end of the second section via the third section;
   an insulating layer having a first side and a second side opposite to the first side, the first side of the insulating layer being disposed on a side of the carrier member;
   a conductive layer having a third side and a fourth side opposite to the third side, the third side of the conductive layer being disposed on the second side of the insulating layer, the conductive layer comprising:
      a first segment disposed on and extending along the first section;
      a second segment disposed on and extending along the second section; and
      a third segment disposed on and extending along the third section, the first segment being connected to the second segment via the third segment; and
   a covering layer disposed on the fourth side of the conductive layer for covering the conductive layer.

25. The cable of claim 24, wherein the first section, the third section, and the second section form a U-shaped structure, and the first segment, the third segment, and the second segment form a U-shaped structure.

26. The cable of claim 24, wherein the carrier member is flexible and resilient.

27. The cable of claim 24, wherein each of the first section and the second section has a non-straight cross section, and the third section has a straight cross section.

* * * * *